(12) United States Patent
Mahajan

(10) Patent No.: US 7,449,901 B2
(45) Date of Patent: Nov. 11, 2008

(54) GROUNDING SCHEME FOR HIGH SPEED PROBING WITH REDUCED LOOP AREA

(75) Inventor: Abhijit V. Mahajan, Bangalore (IN)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/580,520

(22) Filed: Oct. 12, 2006

(65) Prior Publication Data

US 2008/0088328 A1   Apr. 17, 2008

(51) Int. Cl.
*G01R 31/02* (2006.01)

(52) U.S. Cl. .................. 324/754; 324/758
(58) Field of Classification Search ......... 324/754–763, 324/158.1
See application file for complete search history.

(56) References Cited

U.S. PATENT DOCUMENTS

| | | | |
|---|---|---|---|
| 4,336,496 A * | 6/1982 | Schnabl et al. | 324/758 |
| 7,161,365 B2 * | 1/2007 | Gluch et al. | 324/754 |
| 2006/0087314 A1 * | 4/2006 | Zhu et al. | 324/207.17 |
| 2007/0126416 A1 * | 6/2007 | Zhu et al. | 324/207.17 |

* cited by examiner

*Primary Examiner*—Ha Tran T Nguyen
*Assistant Examiner*—Joshua Benitez
(74) *Attorney, Agent, or Firm*—McAndrews, Held & Malloy, Ltd.

(57) ABSTRACT

A grounding scheme for improved high speed probing of a system-under-test ("SUT") using a ground rail positioned on the SUT near each side of a package attached to the SUT having signal access points, whereby each of the ground rails are electrically connected to a ground access point of the SUT. The signal access points may be pins on a conventionally-mounted or surface-mounted package attached to a printed circuit board ("PCB") and may be tested with a probe where the ground pin of the probe is movably connected to each ground rail. The ground rails may also be incorporated within an integrated circuit ("IC") attached to the SUT.

6 Claims, 3 Drawing Sheets

GROUNDING SCHEME FOR HIGH SPEED PROBING WITH REDUCED LOOP AREA

BACKGROUND OF THE INVENTION

1. Field of the Invention

This invention is related to measuring instruments, and in particular to test probes and a system and a method of attaching the test probes to systems under test.

2. Related Art

The cost of testing a printed circuit board ("PCB") assembly is a significant part of the overall cost of producing a product that contains one or more PCBs. As PCB assemblies become more sophisticated and complex and there is greater time-to-market pressure, there is increasing interest in improving methods used to test PCB assemblies. As the individual components become smaller and more are added to the PCB assemblies, the test probes of the measuring instrument used to test these devices have to be made smaller and more efficient.

In general, probing refers to the act of connecting a measuring instrument to a signal access point on a system-under-test ("SUT"). Probing is required to observe signals and the shape of a waveform as it exists at a particular location, i.e., at a particular access point. A typical example may be connecting an oscilloscope (the measuring instrument) to the pin of a dynamic random-access memory ("DRAM") device, which may take the form of a TSOP (Thin Small Outline Package). The probe is a device that establishes a high-fidelity electrical contact between the measuring instrument and a signal access point and "siphons" off a portion of the signal energy and transfers it to the measuring instrument. During this acquisition and transfer, the signal is exposed to the environment and is susceptible to corruption.

Probes typically have a signal pin and a ground pin. The signal pin is attached to a signal access point on the SUT and the ground pin is attached to a ground access point on the SUT. The act of probing may significantly change the waveform being observed, resulting in measurement error. This may happen because of the probe itself as well as the method and the apparatus used to attach the probe to the SUT. As was noted earlier, the signal is exposed to the environment during its "pick-up" and transfer to the probe and during its transmission to the measuring instrument and may be corrupted during any of these stages. Thus the manner of attaching the probe to the access point is of great importance and must be accomplished in such a way that it does not degrade, modify, or alter the signal being measured.

In high performance designs (which are typically classified as interfaces of signal lines having fast signal rise times and high frequencies), accurate probing is the key to accurate measurements. In such high performance designs, transmission line effects must be taken into account when designing the physical layout of the system. Accordingly, a probe, when it is connected to an access point of the system, may itself be considered a parasitic component that affects signal integrity. Further, the method of connecting the probe to the SUT plays a vital role in determining if the signal that is "picked-up" from the SUT gets accurately transferred to the probe. Thus, with today's high performance designs, there is an even greater need for improved probes as well as techniques that preserve the integrity of the signal during its "pick-up" and subsequent transfer to the probe.

FIG. 1 shows a schematic block diagram illustrating an SUT 100 being tested by a conventional probe 104. In FIG. 1, the SUT 100 may be a printed circuit board ("PCB") that may have multiple surface-mounted and chip scale packages attached. In FIG. 1, a thin small outline package ("TSOP") 102 is shown, which may be, as an example, a DRAM device. TSOPs are surface-mount devices with a very fine pitch between pins and are installed on the surface of the SUT 100.

Probe 104 has a signal pin 106 and a ground pin 108 and is used to connect a signal access pin on the SUT 100, to a measuring instrument (not shown). To measure a signal, the signal pin 106 of probe 104 is connected to a signal access pin of TSOP 102, which may be one of the pins 120 of TSOP 102. To complete the connection, the ground pin 108 must be attached to a ground access point 112 on the SUT 100.

In general, a PCB may have a flat plate or base of insulating material containing a pattern of conducting material, and may be single-sided, double-sided, or multi-layer, with several power and ground planes. A ground plane of the PCB may be reached through a ground via, which is a plated-through hole in the PCB used to route a trace vertically in the PCB, that is, from one layer to another. If a ground via is not located on the PCB near the ground pin 108 of the probe, then a grounding wire 110 is required to connect the ground pin 108 of the probe 104 and the ground access point 112 of the PCB.

In FIG. 1, grounding wire 110 connects ground pin 108 of the probe 104 to ground access point 112 of the PCB 100. This connection forms loop area 114 that is a source of signal integrity problems. Because of the larger loop area created by the length of the grounding wire 112, it acts as an antenna to pick up any stray noise in the SUT 100. Additionally, such a connection is highly inductive in nature, and degrades the rise time of the signal that is actually transferred to the probe. This leads to inaccurate measurements, particularly in the case of high performance systems. The loop area 114 is used to illustrate the extent of such problems, with a larger area being more conducive to noise problems and greater inaccuracies in measurement.

Additionally, the use of a ground via to make a connection to a ground plane presents other potential problems. Generally, use of a ground via results in a relatively small loop area, thus allowing for accurate testing results. However, repositioning the probe requires great care and repeated probing will often cause damage to the ground via. Moreover, even the slightest movement may knock the ground pin from its desired location. And effective use of a ground via requires that it be located near each signal access point that is to be tested.

Another approach is to use a grounding wire soldered to the PCB and the probe. An advantage of this approach is that it provides a solid connection, with little possibility of damage. However, because a large loop area is formed, this approach may be acceptable for slow speed interfaces, but will not have the accuracy required for measuring high speed signals.

Therefore, there is a need for a probe capable of accurately measuring high speed signals and that is also able to be easily repositioned for additional testing without causing damage to the SUT or to the probe.

BRIEF SUMMARY OF THE INVENTION

A system and/or a method is provided for a grounding scheme implemented on a System-under-Test ("SUT"), substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

BRIEF DESCRIPTION OF THE DRAWINGS

The invention can be better understood with reference to the following figures. The components in the figures are not necessarily to scale, emphasis instead being placed upon illustrating the principles of the invention. In the figures, like reference numerals designate corresponding parts throughout the different views.

DETAILED DESCRIPTION

A grounding scheme implemented on an SUT is disclosed as well as a method for testing signal access points on an SUT using ground rails positioned on the SUT. Also disclosed is a method of fabricating an SUT that includes placing ground rails near or on top of all signal access points on the SUT. The SUT may be any electronic system having one or more components having pins, where the package may be conventionally or surface mounted to the SUT. The grounding scheme may include ground rails positioned along the length or width of each package on the SUT that has pins, such that there may be a separate ground rail that is parallel to each row of pins on the component. Each ground rail is in signal contact with a ground access point on the SUT, whether through a ground via or other electrical connection. The ground rail may be made of any electrically conductive material, such as exposed gold-plated copper. This ground rail may be positioned next to, or on top of, each package whose pins are being probed.

In an example of operation, a signal pin of a probe may be connected to a signal access point on the SUT, and a ground pin of the probe may be connected to a ground rail positioned on the SUT near the signal access point being tested. The signal access point may be one of multiple pins on a side of any conventionally-mounted or surface-mounted component, which components may include a conventionally-mounted Dual In-line Package ("DIP"), or a surface-mounted Small Outline J-Lead package ("SOJP") or Thin Small Outline Package ("TSOP"). When the testing of the first signal access point is completed, the next test may be started by moving the signal pin to the next signal access point to be tested, while the ground probe pin remains attached to the ground rail and glides along the ground rail with minimal friction as needed so as allow the probe to be easily repositioned to a new testing position. Thus with this grounding scheme, multiple signals may be tested with only the signal pin of the probe being repositioned.

Figure 1:
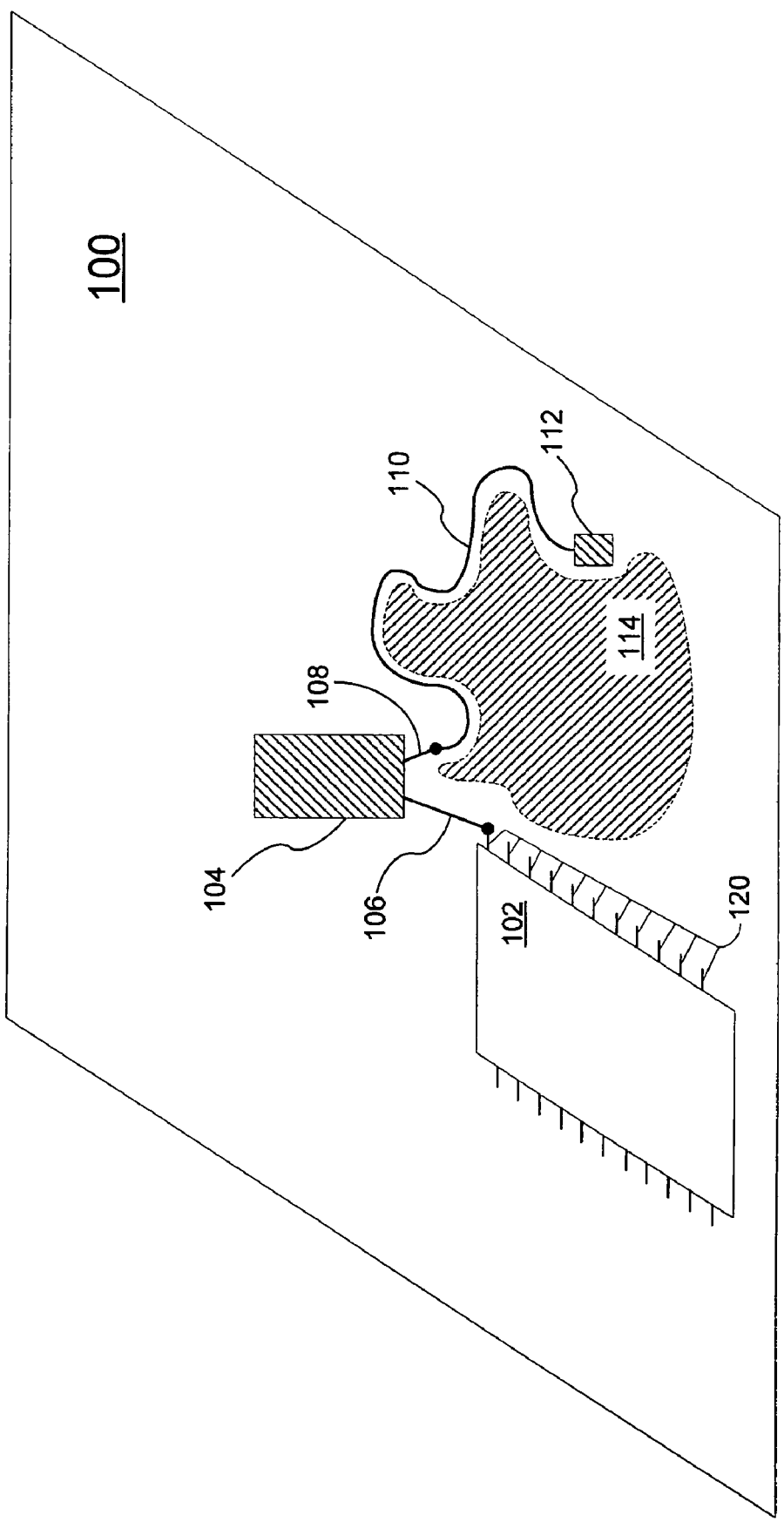
FIG. 1 shows a schematic block diagram illustrating an example of a System-under-Test ("SUT") being tested by a known example of a probe.
Figure 2:
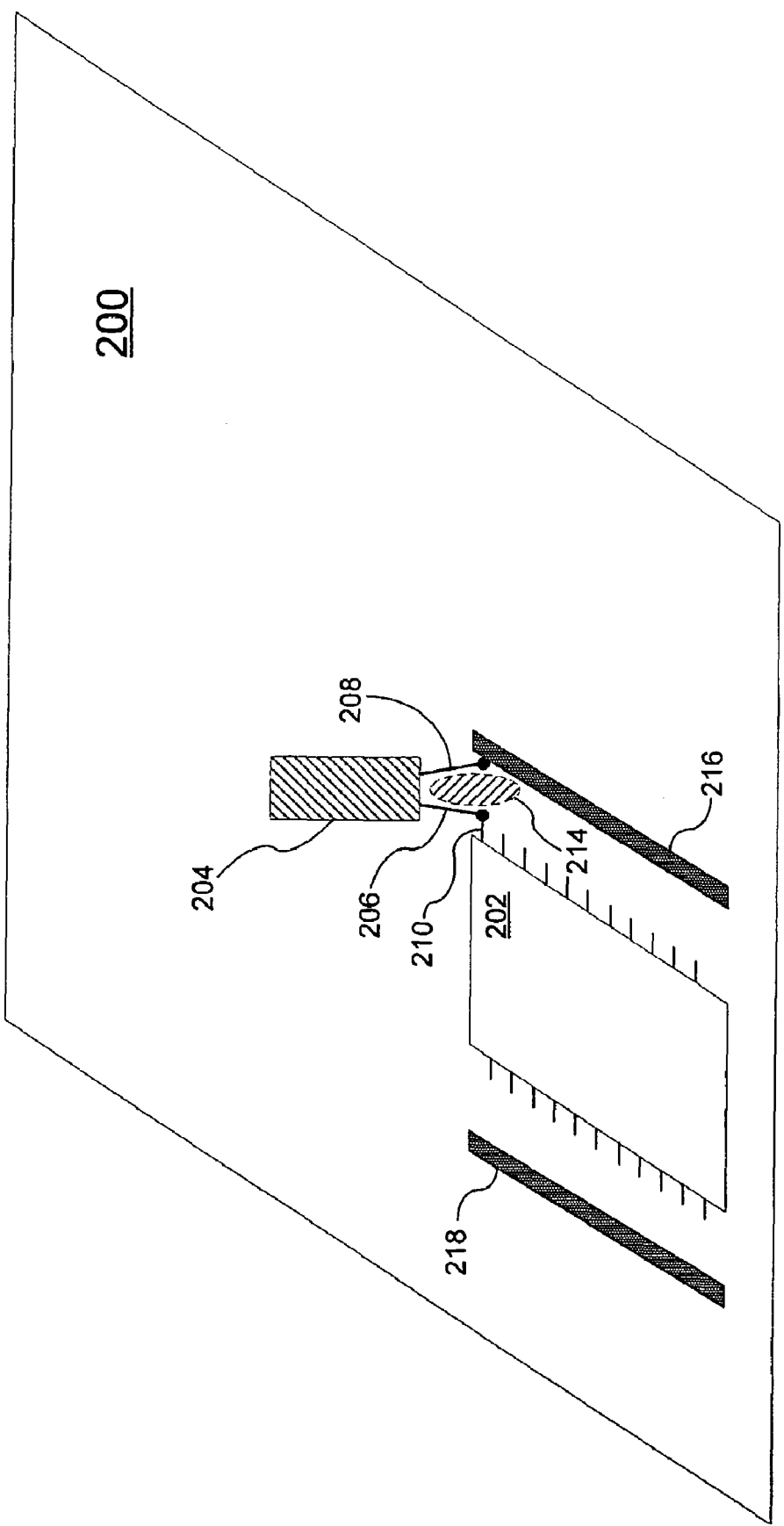
FIG. 2 shows a schematic block diagram illustrating an example of an SUT having ground rails implemented in accordance with the present invention being tested by a probe.

In FIG. 2, a schematic block diagram illustrating an example of an SUT having a grounding scheme implemented in accordance with the present invention is shown. Similar to what is shown in FIG. 1, in FIG. 2, a probe 204 having a signal pin 206 and a ground pin 208 may be used to test signal access points on package 202 that is surface mounted to SUT 200, which may be a PCB. Positioned on the SUT 200 are ground rails 216 and 218. The ground rails 216 and 218 are securely attached to SUT 200 and each is in electrical connection with a ground access point (not shown) on SUT 200. The electrical connection between the ground rails 216 and 218 and a ground access point (not shown) may be made using a ground via or by soldering.

To test a signal access point, in this case, pin 210, the signal pin 206 of probe 204 may be electrically connected to pin 210, and the ground pin 208 may be electrically connected to ground rail 216. Probe 204 may be in signal communication with a measuring instrument (not shown) which, as an example, may be an oscillator. Because of the close proximity of ground rail 216 to pin 210, this connection forms a loop area 214 significantly smaller in area than that of loop area 114, FIG. 1. Thus, using the ground rails 216 and 218, this grounding scheme results in more accurate testing results for the reasons stated above.

When another signal access point is to be tested, the signal pin 206 is disconnected from pin 210 and connected to the next signal access point to be tested. The ground pin 208, however, remains physically connected to ground rail 216 and "glides" along the ground rail 216 as the probe pin 206 is repositioned to connect to the next signal access point to be tested. Thus, when testing the remaining pins of package 202, the loop area loop area 214 remains relatively constant and significantly smaller in area than that of loop area 114, FIG. 1. Additionally, the potential for damage to the SUT due to repeated probing of signal access points is reduced through the use of ground rails 216 and 218.

The ground pin 208 may be connected to the ground rail 216 using several methods. As an example, the ground rail 216 may include a rail or channel in which a microscopic wheel attached to the end of the ground pin 208 may be inserted and then rolled along the ground rail 216 when the next access point is to be tested. Also, the ground rail 216 may include a groove in which a ball-shaped contact pin attached to the end of the ground pin 208 may be inserted and then also rolled along the ground rail 216 when the next access point is to be tested. In another example of an implementation, the ground rail 216 may include a straight wire, where a loop attached to the end of the ground pin 208 may be looped around the wire serving as a ground rail 216. Or as another example of an implementation, the ground rail 216 may include a flat metallic strip along which the end of the ground pin 208 may remain in contact and slide along the ground rail 216 as the probe 204 is moved from one access signal point to another.

In the case of the implementation of the ground rail 216 as a rail or channel, as a groove, or as a flat strip, the ground rail 216 may be incorporated within an IC package itself in lieu of being placed on the PCB. In the case of the straight wire and the loop, this implementation may be used for adapting an already-constructed SUT for the grounding scheme disclosed by this invention.

Additionally, the fact that most packages have a fixed pin-to-pin pitch facilitates a mechanical or robotic movement of the signal pin to the next signal access point by a predetermined, incremental repositioning of the probe after each test. Such automated movement of the signal pin makes repeating the probing process faster while reducing damage to the SUT.

Figure 3:
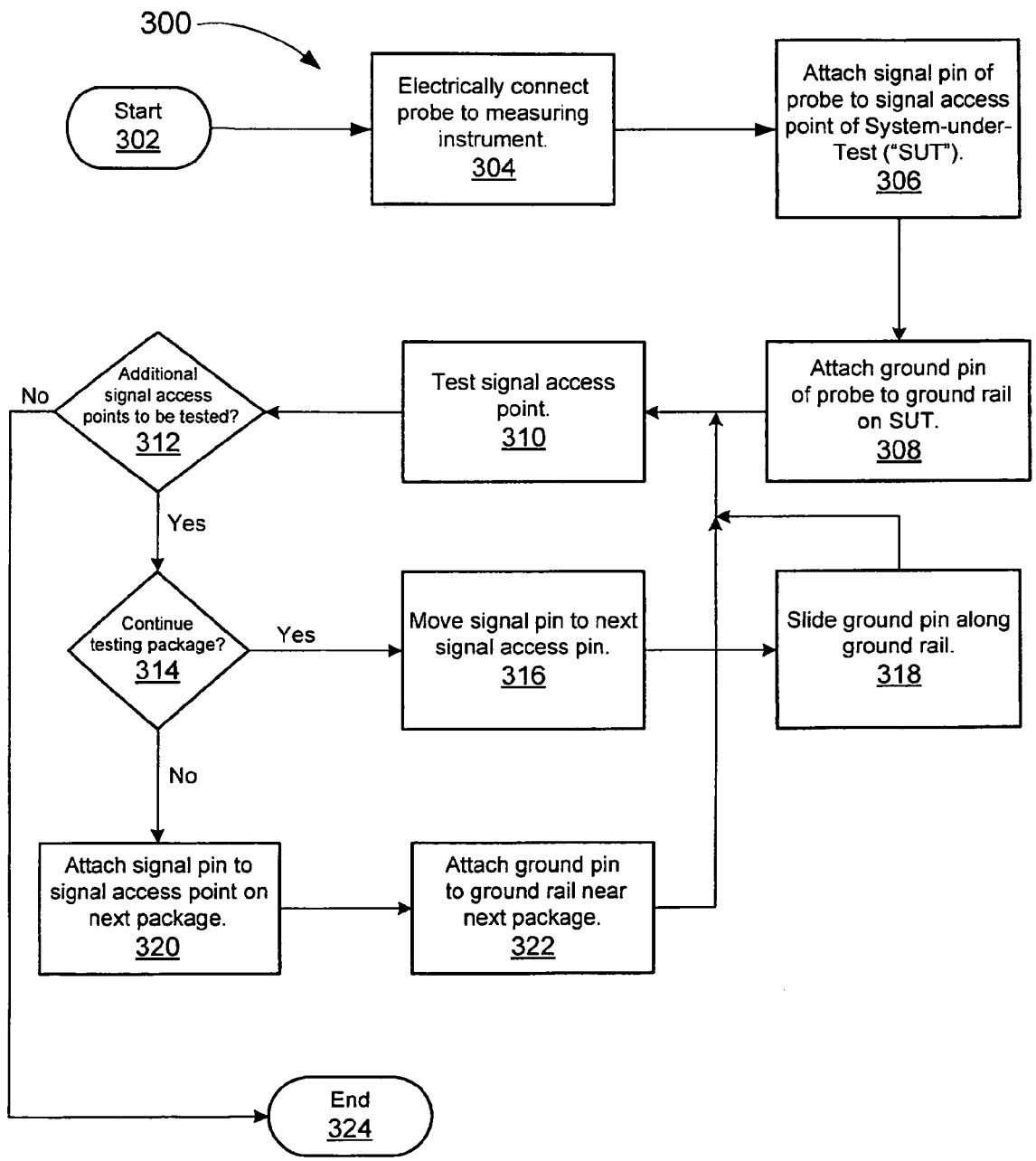
FIG. 3 shows a flow chart for an example of a testing process performed by an implementation of the invention.

In FIG. 3, a flow chart illustrating an example of a testing process performed by an implementation of the invention is shown. In testing process 300, the process starts in step 302, and in step 304, the probe is first electrically connected to a measuring instrument. Next, the signal pin of the probe is attached to a signal access point on a package attached to the SUT in step 306, and in step 308, the ground pin of the probe is movably connected to a ground rail on the SUT that may be positioned near or on top of the package being tested. Thereafter, the signal access point is tested in step 310.

After the testing of a signal access point, a determination is made in decision step 312 as to whether additional testing of the SUT is required. If it is determined that additional testing is required, the process proceeds to decision step 314 where it is determined whether additional testing of the same package is required or whether the process should move to another package on the SUT for further testing. If no further testing is required, the process ends in step 324.

In decision step 314, a decision, in effect, is made whether to continue testing on the package to which the probe is presently attached. If further testing of the same package is required, the signal pin of the probe is moved to the next signal access point on the package in step 316, and in step 318, the ground pin is repositioned on the ground rail by sliding the ground pin along the ground rail to its new position. Once the signal pin and the ground pin of the probe is repositioned, a signal at the new signal access point is tested in step 310. After testing, the process returns to decision step 312.

If in decision step 314, it is determined that testing of the current package has been completed, the process proceeds to step 320 where the signal pin is attached to a signal access point on the next package of the SUT to be tested. In step 322, the ground pin of the probe is attached to another ground rail, one that may be positioned near or on top of the next package of the SUT to be tested. Upon completion of these 2 steps, the process proceeds to step 310, where testing of the signal access point occurs. It is appreciated by those skilled in the art that some of the steps in FIG. 3 may be performed in a different sequence; for example, steps 306 and 308, steps 316 and 318, and steps 320 and 322 may be performed in reverse order, as well as possibly other steps in process 300.

It will be understood that the foregoing description of numerous implementations has been presented for purposes of illustration and description. It is not exhaustive and does not limit the claimed inventions to the precise forms disclosed. Modifications and variations are possible in light of the above description or may be acquired from practicing the invention. The claims and their equivalents define the scope of the invention.

What is claimed:

1. A method of high speed probing using a plurality of ground rails attached to a System-under-Test ("SUT"), the method comprising:

electrically connecting a probe to a measuring instrument;
   attaching a signal pin of the probe to a signal access point of the SUT;
   movably attaching a ground pin of the probe to a ground rail in close proximity to the signal access point by inserting a ball-shaped contact pin attached to an end of the ground pin onto a groove incorporated into the ground rail; and
   testing a signal from the SUT at the signal access point with the probe.

2. The method of claim 1, further including;
   moving the signal pin of the probe to at least one other signal access point of the SUT;
   repositioning the ground pin movably attached to the ground rail by sliding the ground pin along the ground rail;
   attaching the signal pin to the at least one other signal access point; and
   testing a signal at the at least one other signal access point.

3. The method of claim 2, further including determining whether there are additional signal access points to be tested.

4. The method of claim 3, further including repeating the following steps responsive to the determination of whether there are additional signal access points to be tested:
   repositioning the ground pin movably attached to the ground rail;
   attaching the signal pin to the at least one other signal access point; and
   testing a signal at the at least one other signal access point.

5. The method of claim 4, wherein repositioning the ground pin further includes automatically repositioning the probe a predetermined distance and direction from the at least one signal access point to at least one other signal access point of the SUT.

6. The method of claim 4, wherein movably attaching the ground pin to the ground rail further includes placing a wheel attached to an end of the ground pin onto a rail incorporated into the ground rail.

* * * * *